United States Patent [19]
Hsieh et al.

[11] Patent Number: 5,801,997
[45] Date of Patent: Sep. 1, 1998

[54] PING-PONG BOOST CIRCUIT

[75] Inventors: Chung-Wei Hsieh, Luo-dong; Yung-Ching Hsieh; Tah-Kang Joseph Ting, both of Hsin-Chu, all of Taiwan

[73] Assignee: Etron Technology, Inc., Hsin-Chu, Taiwan

[21] Appl. No.: 881,603

[22] Filed: Jun. 24, 1997

[51] Int. Cl.[6] ............................................. G11C 7/00
[52] U.S. Cl. ............................ 365/189.11; 365/189.09; 365/149
[58] Field of Search ..................... 365/189.11, 189.09, 365/149, 230.06

[56] References Cited

U.S. PATENT DOCUMENTS

| | | | |
|---|---|---|---|
| 5,222,042 | 6/1993 | Ichiguchi | 365/189.01 |
| 5,347,488 | 9/1994 | Matsushita | 365/189.11 |
| 5,428,577 | 6/1995 | Yumitori et al. | 365/203 |
| 5,608,677 | 3/1997 | Yoon et al. | 365/189.09 |
| 5,703,814 | 12/1997 | Nishimura et al. | 365/189.09 |
| 5,703,827 | 12/1997 | Leung et al. | 365/189.11 X |

*Primary Examiner*—Huan Hoang
*Attorney, Agent, or Firm*—George O. Saile; Stephen B. Ackerman; Billy J. Knowles

[57] ABSTRACT

A reciprocating or ping-pong voltage boosting circuit is described. The ping-pong boosting circuit has a first and a second boost circuit connected between the power supply voltage source and a ground reference point to generate a first instance and a second instance of a boost voltage. The reciprocating circuit has a switching circuit to alternately place the first and second instance of the boost voltage upon the signal line to bring the voltage level of the signal line to that of the boost voltage. A boost control circuit will provide a switching signal that will control the alternate placing of the first and second instances of the boost voltage upon the signal line. The boost control circuit will provide a boost signal that will cause the first and second boost circuits to generate the first and second instances of the boost voltage.

14 Claims, 7 Drawing Sheets

PING-PONG BOOST CIRCUIT

BACKGROUND OF THE INVENTION

1. Field of the Invention

This invention relates generally to circuits that boost a voltage present on a signal line of an integrated circuit to a magnitude that is greater than a power supply voltage source, and more particularly to such boost circuits used in a Dynamic Random Access Memory Array.

2. Description of Related Art

Figure 1:
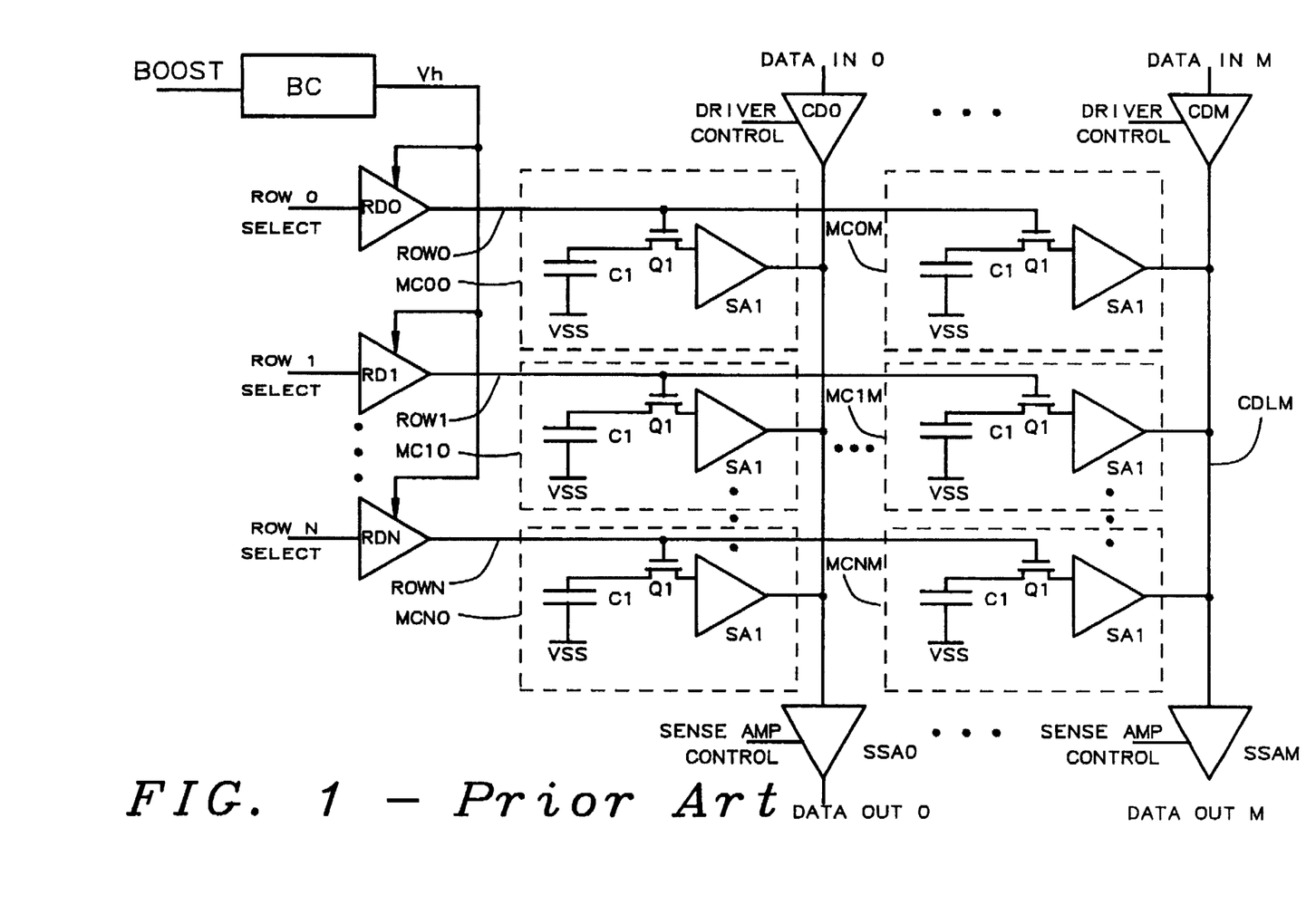
FIG. 1 is a schematic diagram of a DRAM showing a boost circuit of prior art.

The operation and structure of a dynamic random access memory (DRAM) is well understood by those skilled in the art. Referring to FIG. 1 the memory will have an array of memory cells MC00, MC10, . . . , MCN0, . . . , MC0M, MC1M, . . . , MCNM arranged in an array of rows and columns. The memory cell will have a capacitor $C_1$ to store an electrical charge. The N-channel Metal Oxide Semiconductor Field Effect Transistor (MOSFET) $Q_1$ will control the charging and discharging of the capacitor $C_1$. The drain of each MOSFET $Q_1$ within the memory cells MC00, MC10, . . . , MCN0, . . . , MC0M, MC1M, . . . , MCNM will be connected to a first stage sense amplifier SA1 where the voltage from the electrical charge present on the capacitor $C_1$ is amplified. Second stage sense amplifiers SSA0, . . . , SSAM and column drivers CD0, . . . , CDM are attached to the column data line CDL0, . . . , CDLM. The second stage sense amplifiers SSA0, . . . , SSAM detect the presence of the signal that represents the electrical charge that represents the digital data that is present on any of the memory cells MC00, MC10, . . . , MCN0, . . . , MC0M, MC1M, . . . , MCNM. The column drivers CD0, . . . , CDM to write the charge that represents the digital data to the capacitor within the memory cells MC00, MC10, . . . , MCN0, . . . , MC0M, MC1M, . . . , MCNM.

The sense amp control is selected by a column decoder (not shown) during a read operation. The selected second stage sense amplifier SSA0, . . . , SSAM will detect the presence or absence of the electrical signal from the first stage sense amplifier SA1 that represents charge from the memory cells MC00, MC10, . . . , MCN0, . . . , MC0M, MC1M, . . . , MCNM and transfers the sensed data to the data output DATA OUT 0, . . . , DATA OUT M. During the write operation the column decoder (not shown) will select the DRIVER CONTROL to activate the column driver CD0, . . . , CDM to transfer the input data DATA IN 0, . . . , DATA IN M to the selected column.

The gate of each MOSFET $Q_1$ within each memory cell MC00, MC10, . . . , MCN0, . . . , MC0M, MC1M, . . . , MCNM will be the row control circuitry. The row control circuitry has a row driver RD0, RD1, . . . , RDN. The input of the row driver RD0, RD1, . . . , RDN is connected to the row decoder which will select the row Row 0, Row 1, . . . , Row N that will be activated.

In order to guarantee that the MOSFET $Q_1$ within the memory cell is fully conducting when a row Row 0, Row 1, . . . , Row N is selected, the voltage present on the selected row Row 0, Row 1, . . . , Row N has to be brought to a level greater than the voltage present on the capacitor $C_1$ of the memory cell plus the threshold voltage of the MOSFET $Q_1$ within the memory cell. If the capacitor $C_1$ is charged to a value that represent a logical 1, the voltage present on the capacitor $C_1$ approaches that of the power supply source. this will require the voltage present on the row Row 0, Row 1, . . . , Row N to be brought to a level greater than the power supply voltage source plus the threshold voltage of the MOSFET $Q_1$ within the memory cell.

The boost circuit BC will generate the boost voltage $V_h$ for one row which has been activated of the rows Row 0, Row 1, . . . , Row N. The boost circuit traditionally will use the charging of a capacitor and the switching of the voltage on the plates of the capacitor to bring the voltage $V_h$ from that of the power supply voltage source $V_{cc}$ to the boosted voltage when the boost signal in activated.

Figure 2A:
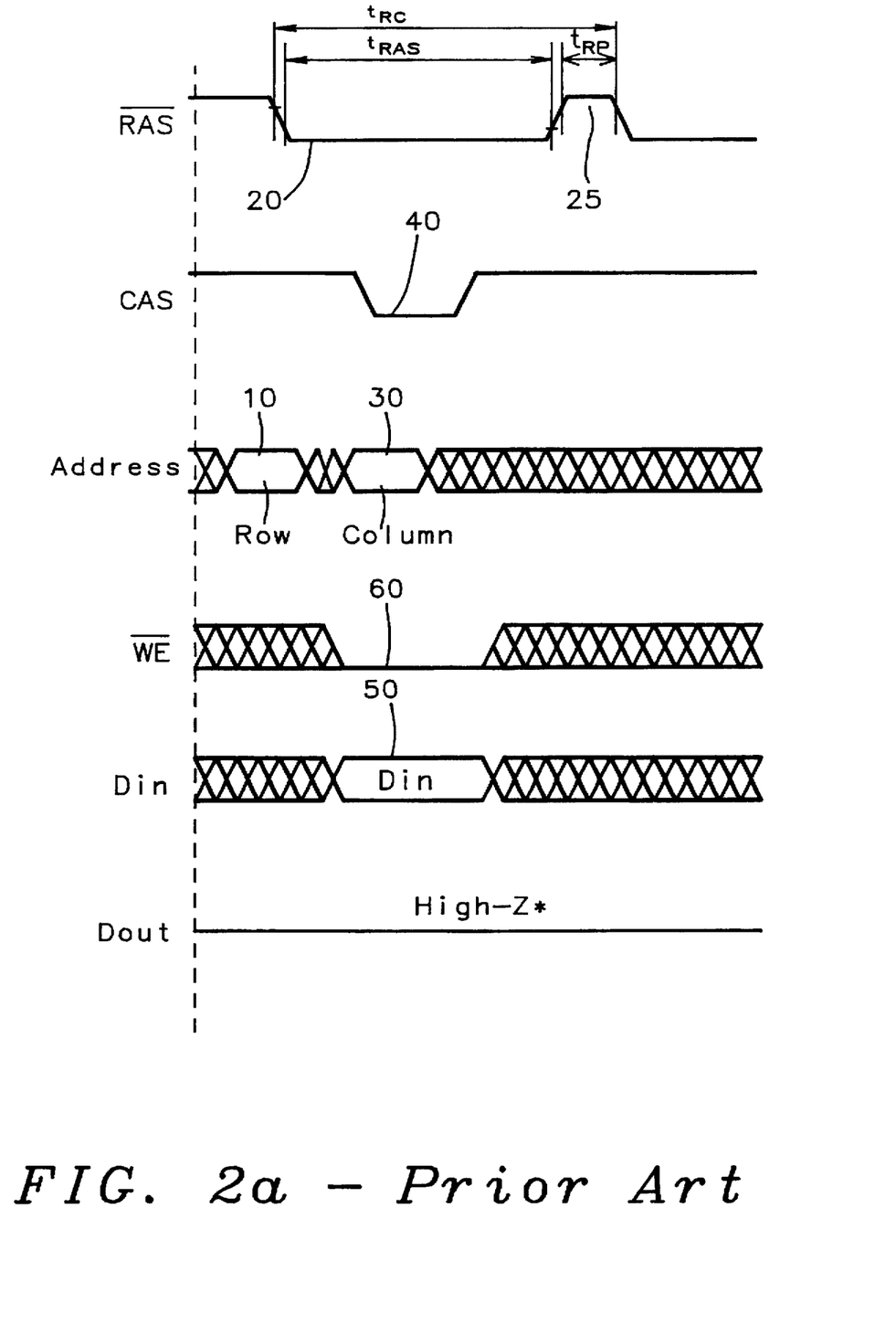
FIGS. 2a and 2b illustrate the timing diagram of a write cycle and a read cycle of prior art.
Figure 2B:
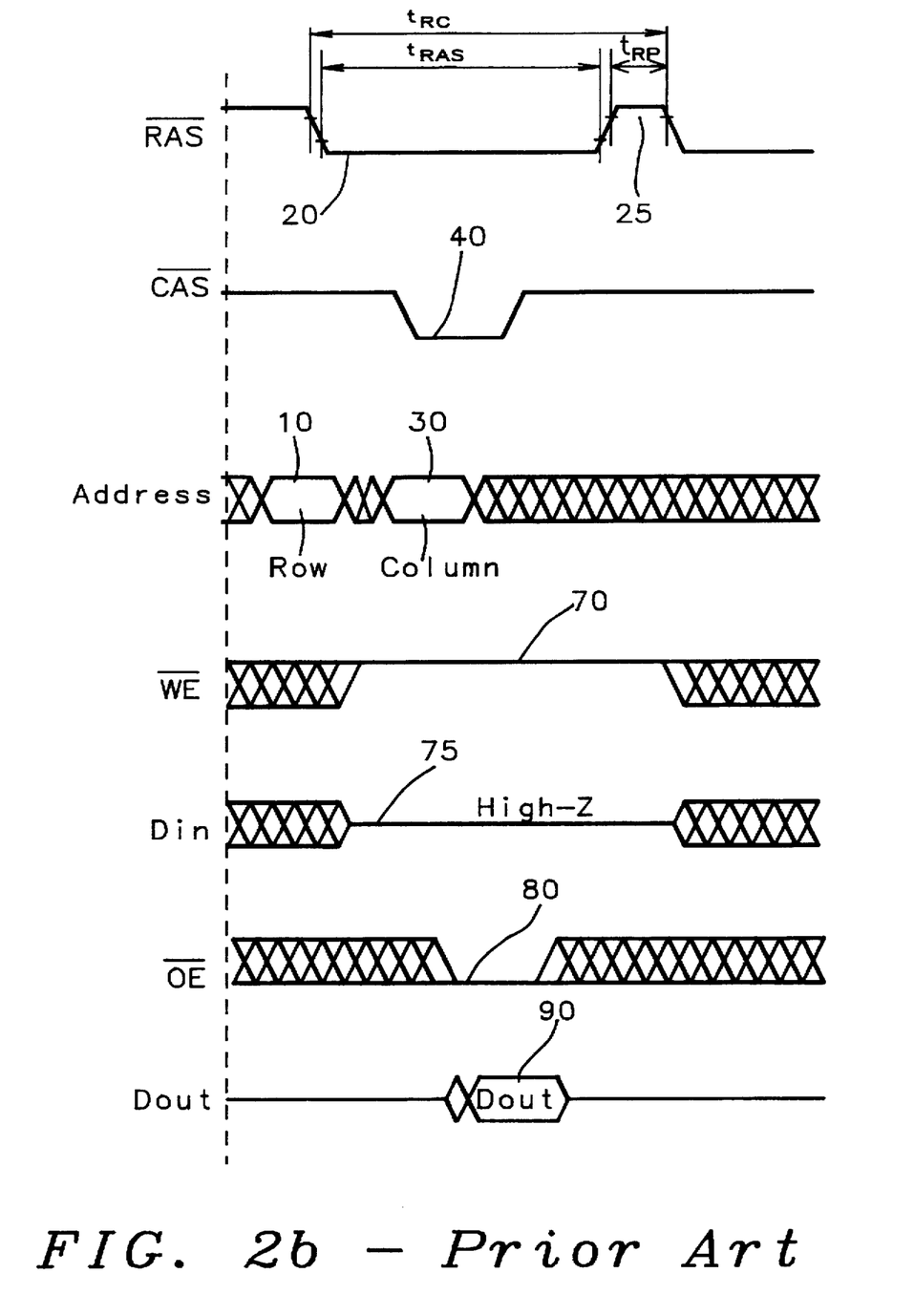

FIGS. 2a and 2b show the timing diagram for the read and write cycle of a DRAM. For either the write cycle or the read cycle, the timing for the cycle is established by the Row Address Strobe Signal ($\overline{RAS}$) and the Column Address Strobe Signal ($\overline{CAS}$). The address signals of the DRAM are time domain multiplexed on the address lines. The read or write cycle will begin with the row address becoming active 10. Once the row addresses have become stable, the $\overline{RAS}$ signal is brought active 20. The row address decoder will select the desired single row Row 0, Row 1, . . . , Row N of FIG. 1 of the DRAM array. After the single row has been selected, the column addresses are brought active 30. After the column address are stable, the $\overline{CAS}$ signal is made active 40. The column address decoder will then select the desired column of the DRAM. Din is brought active and the write enable signal $\overline{WE}$ is brought active 60 which will cause the data to be placed in the selected DRAM cell. However, if the cycle is to be a read cycle, the write enable is disabled 70 as shown in FIG. 2b, the data input Din is disabled 75 and the output enable $\overline{OE}$ will activate the selected column second stage sense amp and off chip drivers (not shown) and the output data Dout will become active 90.

At the completion of the read or write cycle the Row Address Strobe line $\overline{RAS}$ will become inactive 25 or alternatively, the Column Address Strobe $\overline{CAS}$ is not applied during this period of the Row Address Strobe $\overline{RAS}$. The time $t_{RAS}$ is the time the Row Address Strobe line $\overline{RAS}$ could be, in one alternative, active to successfully complete a read or write operation of the DRAM. The difference between the DRAM cycle time $t_{RC}$ and the time $t_{RAS}$ is the row address precharge time $t_{RP}$.

Figure 3A:
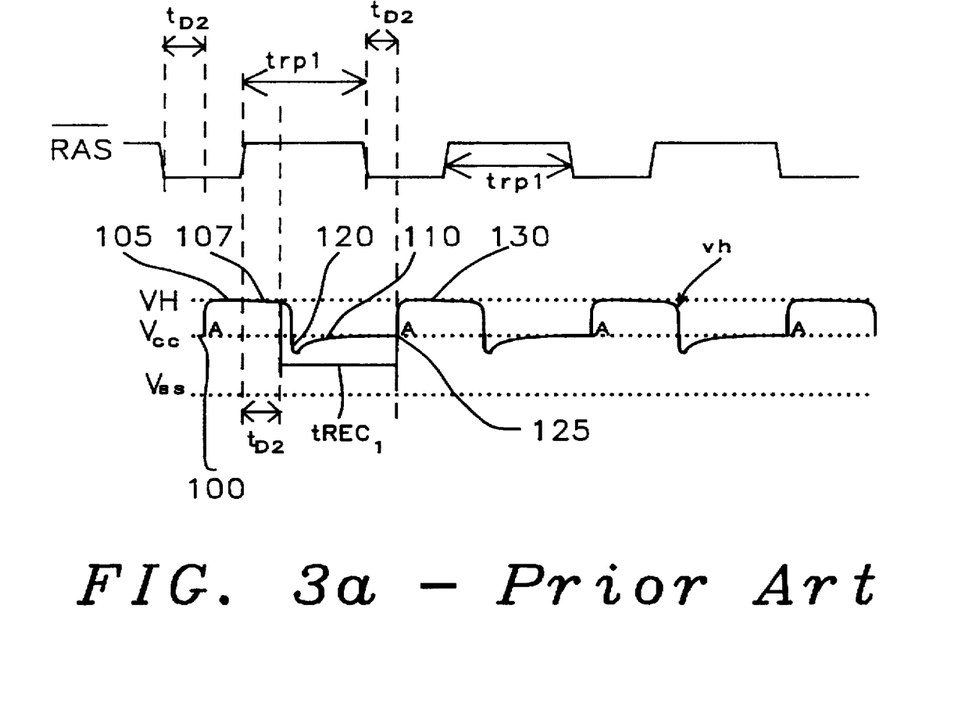
FIGS. 3a and 3b illustrate the timing diagrams of a boost circuit related to the $\overline{RAS}$ signal of the prior art.
Figure 3B:
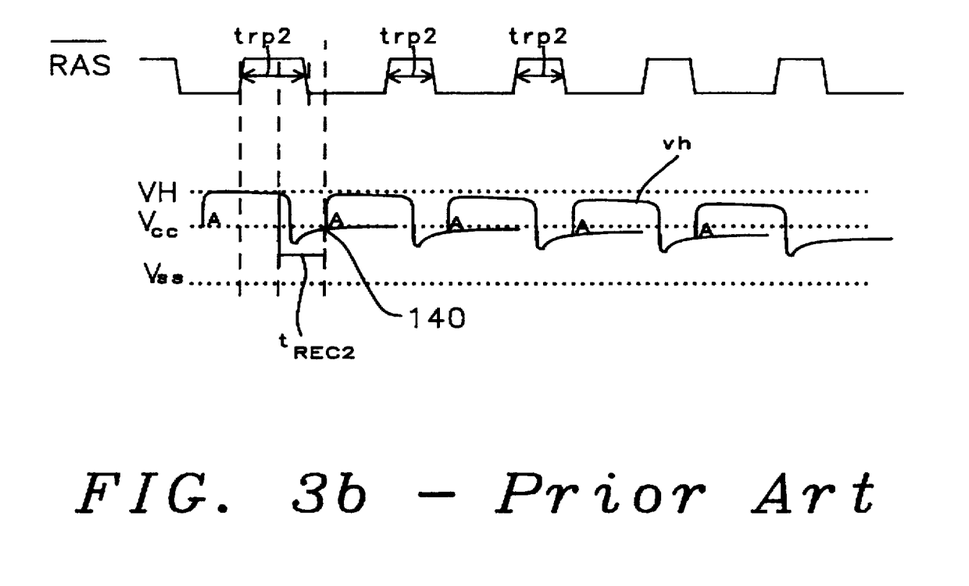

Referring now to FIGS. 3a and 3b, the waveforms are the voltage level of the signal $V_h$ of FIG. 1 compared with the Row Address Strobe $\overline{RAS}$. Initially the level of the signal $V_h$ is at the power supply voltage source $V_{cc}$ 100. After a period of time $t_{D2}$, when the row decode circuitry has selected the desired row address, the signal $V_h$ is boosted 105 by the boost circuit BC of FIG. 1 to the voltage level $V_H$. When the row address cycle is finished, the row address strobe line $\overline{RAS}$ is turned off 107. After a precharge delay $t_{D1}$, the signal $V_h$ will now be brought 110 to the level of the power supply voltage source $V_{cc}$. Ideally, this would occur instantaneously, however, there is an under shoot 120 where the signal $V_h$ falls below the level of the power supply voltage source $V_{cc}$.

The row precharge time $t_{RP1}$ is selected to allow complete recovery of the signal $V_h$ to the level of the power supply voltage source $V_{cc}$. If this recovery time $t_{REC1}$ can be shortened, the row precharge time $t_{RP1}$ can be shortened this improving the performance of the DRAM.

If the recovery cycle were shortened to that of $t_{RP2}$ as shown in FIG. 3b, the voltage level of the voltage $V_h$ would not have fully recovered 140 to the level of the power supply voltage source $V_{cc}$. When the boost circuit BC of FIG. 1 is activated, the voltage level of the voltage $V_h$ would not reach the boost level VH. In fact in subsequent cycles the voltage levels of the voltage $V_h$ would progressively decrease until the MOSFET $Q_1$ of the memory cells MC00, MC10, . . . , MCN0, . . . , MC0M, MC1M, . . . , MCNM in FIG. 1 would not be fully conducting causing a fault within the DRAM.

SUMMARY OF THE INVENTION

An object of this invention is to minimize an initialization time between periods of providing the voltage level that is greater that the level of the power supply voltage source and the transmission of a signal upon the signal lines.

To accomplish these and other objects a reciprocating boost circuit has a first and a second boost circuit connected between the power supply voltage source and a ground reference point to generate a first instance and a second instance of a boost voltage. The reciprocating circuit has a switching circuit to alternately place the first and second instance of the boost voltage upon the signal line to bring the voltage level of the signal line to that of the boost voltage. A boost control circuit will provide a switching signal that will control the alternate placing of the first and second instances of the boost voltage upon the signal line. The boost control circuit will provide a boost signal that will cause the first and second boost circuits to generate the first and second instances of the boost voltage.

DETAILED DESCRIPTION OF THE INVENTION

Figure 4:
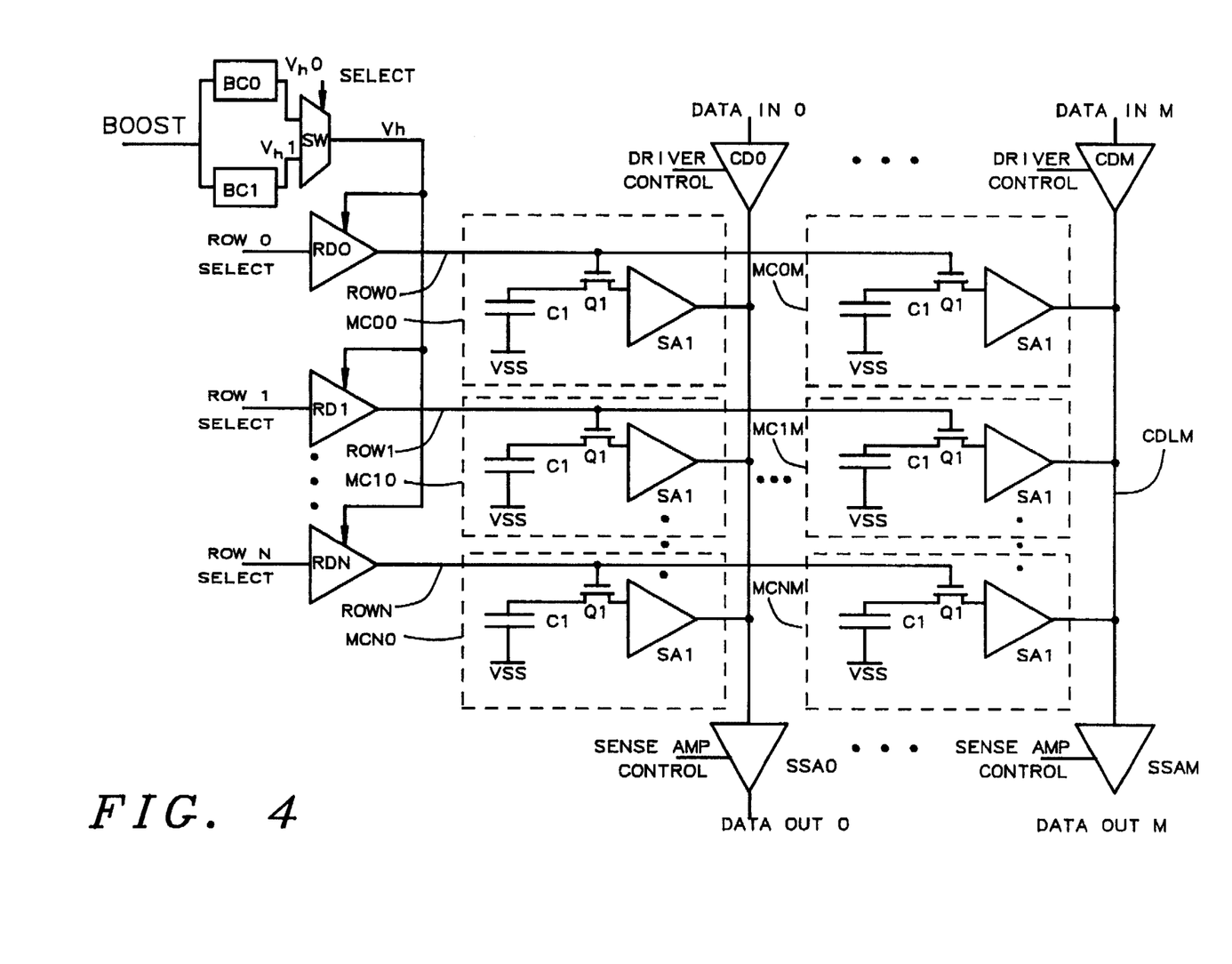
FIG. 4 is a schematic diagram of a DRAM incorporating a reciprocating or ping-pong boost circuit of this invention.

FIG. 4 shows a schematic diagram of a DRAM incorporating a reciprocating or ping-pong boost circuit. The basic structure of the DRAM is identical to that described in FIG. 1. The boost voltage line $V_h$ is connected as in FIG. 1 to each of the row drivers RD0, RD1, . . . , RDN. The ping-pong boost circuit will have two boost circuits BC0 and BC1 to generate two separate boost voltages $V_{h0}$ and $V_{h1}$. The switch SW will alternately place the boost voltages $V_{h0}$ and $V_{h1}$ at the boost voltage line $V_h$ dependent on the level of the select signal. The boost signal will provide the timing necessary to generate the boost voltages $V_{h0}$ and $V_{h1}$.

Figure 5:
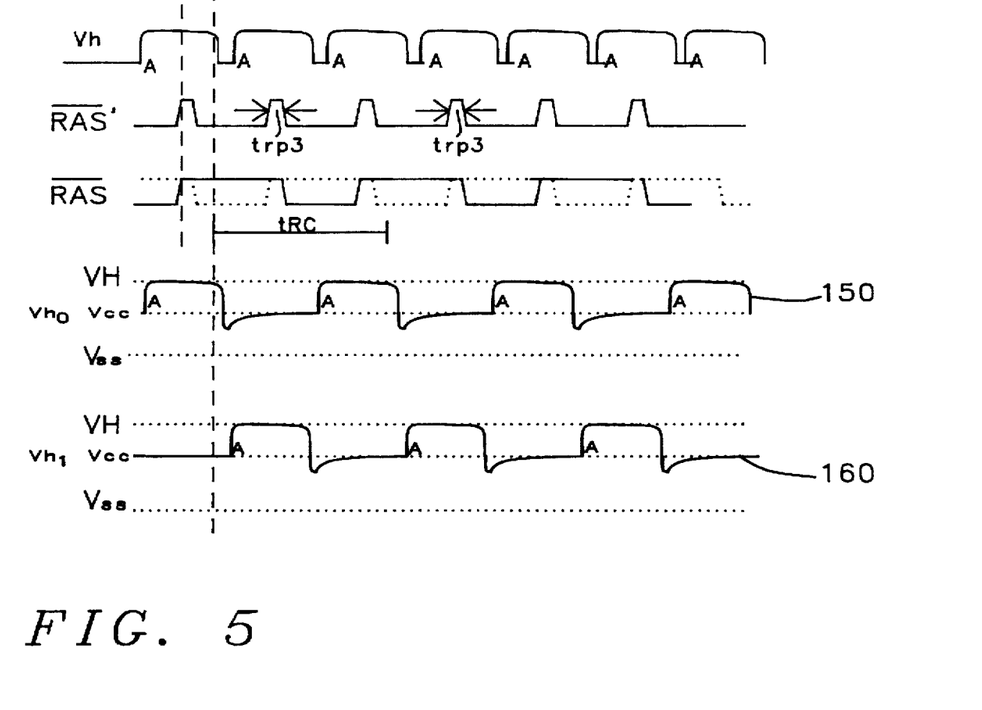
FIGS. 5 and 6 are timing diagrams of a reciprocating or ping-pong boost circuit of this invention.
Figure 6:
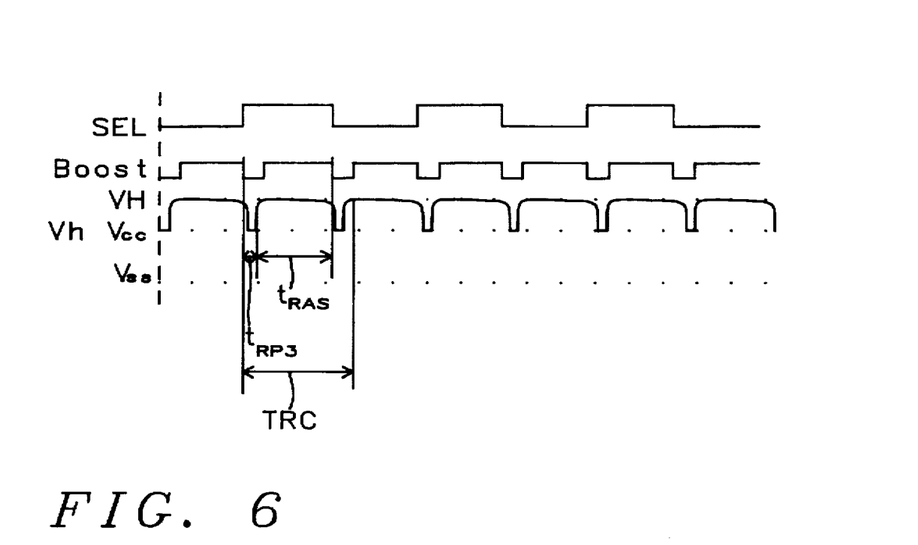

Refer now to FIGS. 5 and 6 to understand the operation of the ping-pong boost circuit. In FIG. 5, the voltage $V_{h0}$ is generated in a fashion identical that described in FIG. 3a, while the voltage $V_{h1}$ will be generated identical to that of the FIG. 3a except that the voltage $V_{h1}$ is boosted to a level VH during the time $t_{REC}$ while the voltage $V_{h0}$ is recovering to the voltage level of the power supply voltage source $V_{cc}$.

The key factor of this invention is to provide separate boost voltages $V_{h0}$ and $V_{h1}$. These separate boost voltages $V_{h0}$ and $V_{h1}$ are to be interleaved to provide the boost voltage level $V_H$ to the boost voltage line $V_h$ of FIG. 4. When the first boost voltage $V_{h0}$ is applied to the boost voltage line $V_h$ 150, the second boost voltage $V_{h1}$ at will be recovering from the undershoot 160. This switching from one fully recovered boost voltage will allow the row precharge time $t_{RP3}$ to be very short as shown in FIG. 5.

The boost voltage line $V_h$ can be at the voltage level of $V_H$ during the recovery interval $t_{rc}$ and the precharge recovery time $t_{RP3}$ can be made as short as possible by insuring that the boost start point at A is independent of the previous coupled level. This means that the point A must always be kept at the power supply voltage source $V_{cc}$. An aggressive row precharge time $t_{RP}$ is achieved as follows:

$$(2t_{RP3}+t_{RAS}) > t_{REC}$$

$$t_{RP3} \geq \frac{1}{2}(t_{REC}-t_{RAS})$$

$$Min(t_{RP}) \geq \frac{1}{2}(t_{REC}-t_{RAS})$$

The minimum row address strobe cycle time $t_{RC}$ then is:

$$t_{RC}=t_{RP3}+t_{RAS}$$

The time for the row address strobe $t_{RAS}$ is the minimum time the boosted voltage line $V_h$ must maintain the level of the voltage at $V_H$.

The ping-pong boost circuit of this invention will replace the boost circuit of the prior art. To contrast the prior art with the present invention, if two boost cycles are required to the same set of rows Row0, Row1, . . . , RowN of both FIG. 1 and FIG. 4, the row precharge time $t_{rp1}$ required of the boost circuit of FIG. 1 would have to be greater than the recovery time $t_{REC}$, as discussed above. Whereas, if two boost cycles are required to the same set of rows, Row0, Row1, . . . , RowN, the switch circuit SW of FIG. 4 will first switch the boost voltage $V_{h0}$ to the selected row drivers RD0, RD1, . . . , RDN and then on the next row address strobe $\overline{RAS}$, the switch SW will switch the boost voltage $V_{h1}$ to the selected row driver RD0, RD1, . . . , RDN. This will minimize the row precharge time $t_{RP3}$ while allowing each boost circuit sufficient recovery time $t_{REC}$.

The waveform of FIG. 6 shows the results of the switch of the voltages $V_{h0}$ and $V_{h1}$ to create the voltage $V_h$. The select signal will switch to reciprocate from the first boost circuit BC0 to the second boost circuit BC1 (as shown in FIG. 4). The boost signals will cause the voltage $V_h$ to be clamped 210 to the level of the power supply voltage source $V_{cc}$ and then boosted to the voltage VH 215 (as shown in FIG. 6).

The repetitive switching from the first boost circuit BC0 to the second boost circuit BC1 will allow a relatively short precharge time $t_{rp3}$. Since the Row Address Strobe time $t_{RAS}$ is fixed and the only component the DRAM cycle time $t_{RC}$ that can be easily modified is the row precharge time $t_{RP}$. The repetitive switching from the first boost circuit BC0 to the second boost circuit BC1 and back of this invention will allow substantial reduction of the row precharge time $t_{RP}$ penalty within the DRAM cycle time $t_{RC}$.

Figure 7:
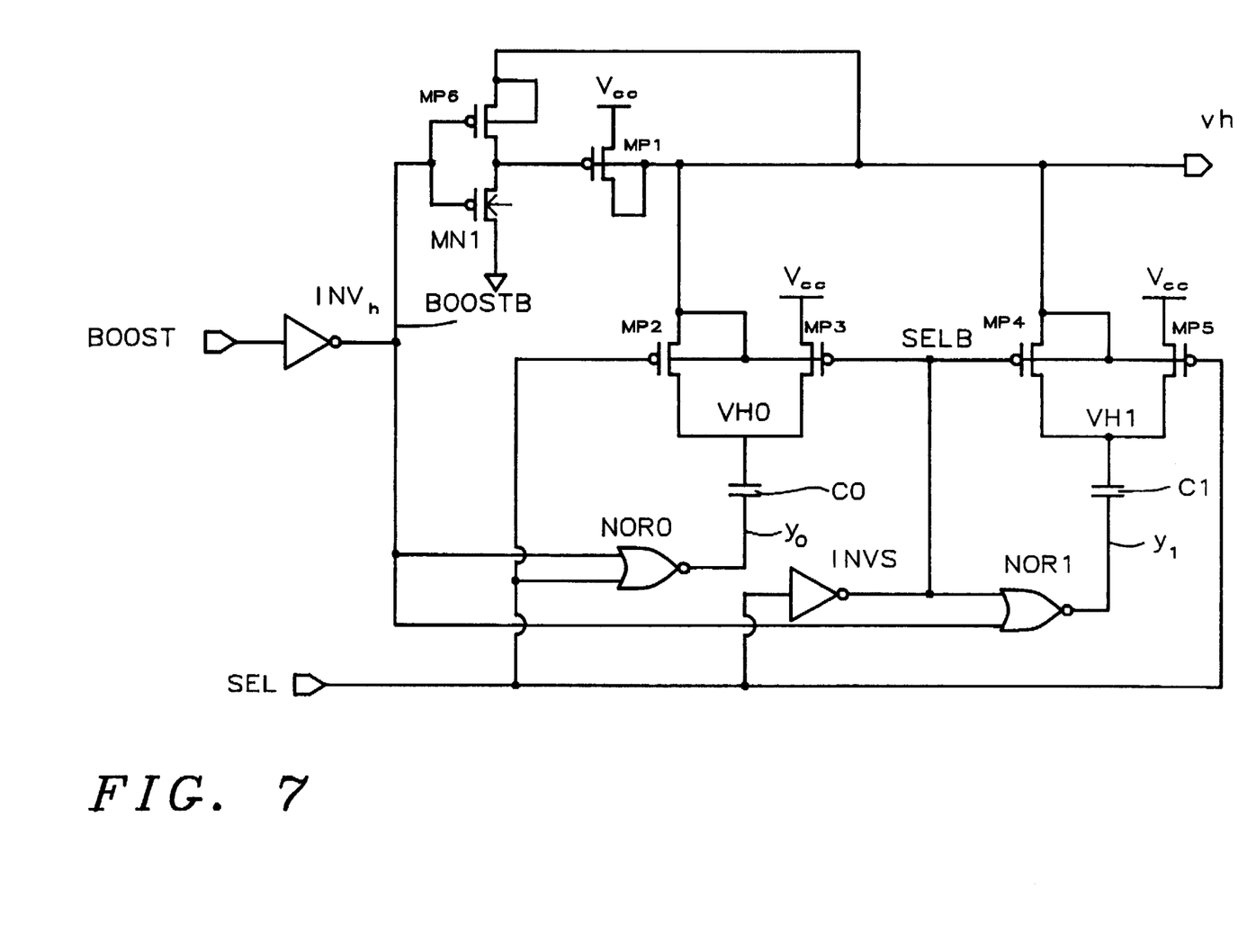
FIG. 7 is schematic diagram of an embodiment of a reciprocating or ping-pong boost circuit of this invention.

An embodiment of the ping-pong boost circuit is shown in FIG. 7. The p-type MOSFET (pMOSFET) Mp1 has a source connected the power supply voltage source $V_{cc}$ and a drain and bulk connected to the output terminal $V_h$. The gate of pMOSFET MP1 is connected to the drains of pMOSFET's Mp6 and n-type MOSFET (nMOSFET) Mn1. The source and the bulk of the pMOSFET Mp6 is connected to the output terminal $V_h$ and source of nMOSFET Mn1 is connected the ground reference point. The gates of the pMOSFET Mp6 and nMOSFET Mn1 are connected to the inverted form of the boost signal BOOSTB.

The pMOSFET Mp2 has a drain and bulk connected to the output terminal $V_h$. The gate of the pMOSFET Mp2 is connected to the select signal. The drain of the pMOSFET Mp2 is connected to the first plate VH0 of the first capacitor C0.

The source of pMOSFET Mp3 is connected to the power supply voltage source and the bulk of pMOSFET Mp3 is connected to the output terminal $V_h$. The gate of the pMOSFET Mp3 is connect to the inverted form of the select signal SELB. The drain of the pMOSFET Mp3 is connected to the first plate VH0 of the first capacitor C0.

The second plate of the first capacitor C0 is connected to the logical switching circuit NOR0. The two inputs of the logical switching circuit NOR0 are connected respectively to the inverted form of the boost signal BOOSTB and the SELECT signal. The pMOSFET's Mp2 and Mp3, the first capacitor C0 and the logical switching circuit NOR0 form the first boost circuit BC0 of FIG. 4.

The pMOSFET Mp4 has a drain and bulk connected to the output terminal $V_h$. The gate of the pMOSFET Mp4 is connected to the select signal. The drain of the pMOSFET Mp4 is connected to the first plate VH1 of the capacitor C1.

The source of pMOSFET Mp5 is connected to the power supply voltage source and the bulk of pMOSFET Mp5 is connected to the output terminal $V_h$. The gate of the pMOSFET Mp5 is connect to the SELECT signal. The drain of the pMOSFET Mp5 is connected to the first plate VH1 of the second capacitor C1.

The second plate of the second capacitor C1 is connected to the logical switching circuit NOR1. The two inputs of the logical switching circuit NOR1 are connected respectively to the inverted form of the boost signal BOOSTB and the inverted form of the select signal SELB. The pMOSFET's Mp4 and Mp5, the second capacitor C1 and the logical switching circuit NOR1 form the second boost circuit BC1 of FIG. 4.

The inverter INVB forms the inverted boost signals BOOSTB from the input BOOST. The inverter INVS forms the inverted form of the select signal SELB from the input SELECT. The inverters INVB and INVS with the logical switching circuits NOR1 and NOR2 form the switch control SW of FIG. 4.

If the BOOST signal is a logical 0 and the select signals is at a logical 0, the inverted boost signal BOOSTB is a logical 1 and the inverted select signal SELB is at a logical 1. The outputs y0 and y1 of the logical switching circuits NOR0 and NOR1 are at a logical 0. These logical states will cause the pMOSFET Mp1 to conduct, thus placing the level of the power supply voltage source $V_{cc}$ at the output terminal $V_h$. The pMOSFET's Mp2 and Mp5 will be conducting and the pMOSFET's Mp3 and Mp4 will not be conducting thus causing the first plates VH0 and VH1 of the first and second capacitors C0 and C1 to be charged to the level of the power supply voltage source $V_{cc}$. When the pMOSFET Mp4 changes state from conducting to not conducting and the pMOSFET Mp5 begins to conduct the first plate VH1 of the second capacitor C1 will undershoot the level of the power supply voltage source Vcc and have to recharge to the level of the level of the power supply voltage source $V_{cc}$.

If the BOOST signal now changes to a logical 1 and the SELECT signal remains at a logical 0, the pMOSFET Mp1 will turn to a non conducting state and the output y0 of the logical switching circuit NOR0 will be placed at the level of the power supply voltage source $V_{cc}$. The first plate VH0 of the first capacitor C0 will now be raised to the level of VH, which will approach the level of $2 \times V_{cc}$. This voltage doubling action will raise the voltage level of the output terminal to the level of VH.

Now if the BOOST signal is at a logical 0 and the select signals will change to a logical 1, the inverted boost signal BOOSTB is a logical 1 and the inverted select signal SELB is at a logical 0. The outputs y0 and y1 of the logical switching circuits NOR0 and NOR1 are at a logical 0. These logical states will cause the pMOSFET Mp1 to conduct, thus placing the level of the power supply voltage source $V_{cc}$ at the output terminal $V_h$. The pMOSFET's Mp3 and Mp4 will be conducting and the pMOSFET's Mp2 and Mp5 will not be conducting thus causing the first plates VH0 and VH1 of the first and second capacitors C0 and C1 to be charged to the level of the power supply voltage source $V_{cc}$. When the pMOSFET Mp3 begins to conduct the first plate VH0 of the first capacitor C0 will undershoot the level of the power supply voltage source Vcc and have to recharge to the level of the level of the power supply voltage source $V_{cc}$.

If the BOOST signal now changes to a logical 1 and the SELECT signal remains at a logical 1, the pMOSFET Mp1 will turn to a non conducting state and the output y1 of the logical switching circuit NOR1 will be placed at the level of the power supply voltage source $V_{cc}$. The first plate VH1 of the second capacitor C1 will now be raised to the level of VH, which will approach the level of $2 \times V_{cc}$. This voltage doubling action will again raise the voltage level of the output terminal to the level of VH.

While the circuitry of the first boost circuit is placing the voltage level VH at the output terminal $V_h$, the circuitry of the second boost circuit is restoring the charge to the first plate VH1 of the second capacitor C1. Likewise, while the circuitry of the second boost circuit is placing the voltage level VH at the output terminal $V_h$, the circuitry of the first boost circuit is restoring the charge to the first plate VH0 of the first capacitor C0. This reciprocating or ping-pong action will allow the row precharge time $t_{RP}$ of a DRAM to be maintained at a minimum.

While this invention has been particularly shown and described with reference to the preferred embodiments thereof, it will be understood by those skilled in the art that various changes in form and details may be made without departing from the spirit and scope of the invention.

What is claimed is:

1. A reciprocating boost circuit to restore a boost voltage to a signal line within an integrated circuit to minimize an initialization time prior to transmission of a signal upon said signal line, comprising a) a first boost circuit coupled between a power supply voltage source and a ground reference point to generate a first instance of said boost voltage;

b) a second boost circuit coupled between the power supply voltage source and the ground reference point to generate a second instance of said boost voltage;

c) a switching circuit connected between the first and second boost circuits and said signal line of said integrated circuit to alternately apply the first and second instances of the boost voltage to said signal line; and d) a boost control circuit connected to said switching circuit to provide a select signal that will control the alternate application of said first and second instances of the boost voltage and connected to said first and second boost circuits to provide a boost signal to control the generating of said first and second instances of the boost voltage.

2. The circuit of claim 1 wherein individually said first and second boost circuit comprise:

a) a first MOSFET of a first conductivity type to selectively connect said boost voltage to said signal line, having a source and bulk connected to the signal line, a gate connected to said select signal and a drain;

b) a second MOSFET of the first conductivity type to selectively couple the power supply voltage source to provide an electrical charge to create said boost voltage, having a source and bulk connected to the power supply voltage source, a gate connected to the select signal, and drain connected to the drain of the first MOSFET of the first conductivity type; and c) a boost capacitor to store the electrical charge necessary to create said boost voltage, having a first plate coupled to the drains of the first and second MOSFET's of the first conductivity type, and a second plate connected to the boost control circuit;

and wherein said first and second boost circuit jointly include:

d) a third MOSFET of the first conductivity type to alternately connect and disconnect said signal line to the power supply voltage source, having a gate, a source connected to the power supply voltage source, and a drain and bulk connected to the signal line;

e) a MOSFET of a second conductivity type to control the connection of the third MOSFET to said signal line, having a gate connected to the gate of the fourth MOSFET of the first conductivity type, a source connected to a ground reference point, and drain connected the drain the gate of the third MOSFET of the first conductivity type; and f) a fourth MOSFET of the first conductivity type to control the connection of the third MOSFET to said signal line having a source and bulk connected to said signal line, a gate connected to the boost control circuit and a drain connected to the drain of the MOSFET of the second conductivity type.

3. The circuit of claim 2 wherein the switching circuit comprises:

a) a first logic switching circuit to control the storing of the electrical charge on the boost capacitor of the first boost circuit, having a first input terminal coupled to a complementary boost signal, a second input terminal coupled to a select line, and a first output terminal coupled to the second plate of the boost capacitor of the first boost circuit, wherein if the complementary boost signal and the select signal are at a first logic level said first output terminal approaches the voltage level of power supply voltage source and the boost capacitor of the first boost circuit will accept the electrical charge and wherein if the complementary boost signal is at a second logic level and the select signal remains at the first logic level the first output terminal approaches is at the ground reference potential and the voltage level of the first plate of the boost capacitor of the first boost circuit will become the level of the power supply voltage source;

b) a second logic switching circuit to control the storing of the electrical charge on the boost capacitor of the second boost circuit, having a first input terminal coupled to the complementary boost signal, a second input terminal coupled to a complementary select line, and a second output terminal coupled to the second plate of the boost capacitor of the second boost circuit, wherein if the complementary boost signal and the complementary select signal are at a first logic level said second output terminal is at the ground reference potential and the boost capacitor of the second boost circuit will accept the electrical charge and wherein if the complementary boost signal is at the second logic level and the complementary select signal remains at the first logic level the second output terminal approaches a voltage level the is the power supply voltage source and the voltage level of the first plate of the second capacitor of the second boost circuit will become the level of said boost voltage;

c) a boost signal complementing circuit have a boost input terminal to receive a boost signal that will control generation of the boost voltage, and a boost complementer to invert said boost signal to create the complementary boost signal; and d) a select signal complementing circuit having a select input terminal to receive the select signal, and a select complementer to invert the select signal to create the complementary select signal.

4. A voltage boosting circuit to restore a signal line to an initial boost voltage, having a magnitude greater than a power supply voltage source, prior to transmitting a signal upon said signal line, comprising:

a) a first MOSFET of a first conductivity type to selectively connect said boost voltage to said signal line, having a source and bulk connected to the signal line, a gate connected to said select signal and a drain;

b) a second MOSFET of the first conductivity type to selectively connect the power supply voltage source to provide an electrical charge to create said boost voltage, having a source and bulk connected to the power supply voltage source, a gate connected to the select signal, and drain connected to the drain of the first MOSFET of the first conductivity type;

c) a first boost capacitor to store the electrical charge necessary to create said boost voltage, having a first plate terminal connected to the drains of the first and second MOSFET's of the first conductivity type, and a second plate;

d) a third MOSFET of a first conductivity type to selectively connect said boost voltage to said signal line, having a source and bulk connected to the signal line, a gate connected to said select signal and a drain;

e) a fourth MOSFET of the first conductivity type to selectively connect the power supply voltage source to provide an electrical charge to create said boost voltage, having a source and bulk connected to the power supply voltage source, a gate connected to the select signal, and drain connected to the drain of the third MOSFET of the first conductivity type;

f) a second boost capacitor to store the electrical charge necessary to create said boost voltage, having a first plate coupled to the drains of the third and fourth MOSFET's of the first conductivity type, and a second plate;

g) a fifth MOSFET of the first conductivity type to alternately connect and disconnect said signal line to the power supply voltage source, having a gate, a source connected to the power supply voltage source, and a drain and bulk connected to the signal line;

h) a MOSFET of a second conductivity type to control the connection of the third MOSFET to said signal line, having a gate connected to the gate of the fourth MOSFET of the first conductivity type, a source connected to a ground reference point, and drain connected the drain the gate of the third MOSFET of the first conductivity type;

i) a sixth MOSFET of the first conductivity type to control the connection of the fifth MOSFET to said signal line having a source and bulk connected to said signal line, a gate connected to the boost control circuit and a drain connected to the drain of the MOSFET of the second conductivity type;

j) a first logic switching circuit to control the storing of the electrical charge on the first boost capacitor, having a first input terminal coupled to the complementary boost signal, a second input terminal coupled to a select line, and a first output terminal coupled to the second plate of the first boost capacitor, wherein if the complementary boost signal and the select signal are at a first logic level said first output terminal is at the ground reference potential and the first boost capacitor will accept the electrical charge and wherein if the complementary boost signal is at a second logic level and the select signal remains at the first logic level the first output terminal approaches a voltage level the is the power supply voltage source and the voltage level of the first plate of the first capacitor will become the level of said boost voltage;

k) a second logic switching circuit to control the storing of the electrical charge on the second boost capacitor, having a first input terminal coupled to a complementary boost signal, a second input terminal coupled to a complementary select line, and a second output terminal coupled to the second plate of the second boost capacitor, wherein if the complementary boost signal and the complementary select signal are at a first logic level said second output terminal is at the ground reference potential and the second boost capacitor will accept the electrical charge and wherein if the complementary boost signal is at the second logic level and the complementary select signal remains at the first logic level the second output terminal approaches a voltage level the is the power supply voltage source and the voltage level of the first plate of the second capacitor will become the level of said boost voltage;

l) a boost signal complementing circuit have a boost input terminal to receive a boost signal that will control generation of the boost voltage, and a boost complementer to invert said boost signal to create the complementary boost signal;

m) a select signal complementing circuit having a select input terminal to receive the select signal, and a select complementer to invert the select signal to create the complementary select signal; and n) a boost control circuit connected to said switching circuit to provide the select signal that will control the alternate connection of said first and second instances of the boost voltage and connected to said first and second boost circuits to provide the boost signal to control the generating of said first and second instances of the boost voltage.

5. The circuit of claim 4 wherein, a) when the boost signal is a first state and the select signal is at the first state, the signal line and the first plates of the first and second boost capacitors are coupled to the power supply voltage source and the second plates of the first and second boost capacitors are coupled to the ground reference point through the first and second logic switching circuits thus placing said electrical charge on said first and second boost capacitors;

b) when the boost signal becomes a second logic state and the select signal remains at the first logic state, the signal line is uncoupled from said power supply voltage source, the second plate of the first boost capacitor is coupled through the first logic switching circuit to the power supply voltage source thus boosting a voltage at said first plate of the first boost capacitor to the boost voltage and connection said boost voltage to said signal line;

c) when the boost signal is a first state and the select signal is at the second state, the signal line and the first plates of the first and second boost capacitors are coupled to the power supply voltage source and the second plates of the first and second boost capacitors are coupled to the ground reference point through the first and second logic switching circuits thus placing said electrical charge on said first and second boost capacitors; and d) when the boost signal becomes a second logic state and the select signal remains at the second logic state, the signal line is uncoupled from said power supply voltage source, the second plate of the second boost capacitor is coupled through the second logic switching circuit to the power supply voltage source thus boosting a voltage at said first plate of the second boost capacitor to the boost voltage and connection said boost voltage to said signal line.

6. A method to restore a boost voltage on a signal line of an integrated circuit to a boost voltage that has a magnitude that is greater than a magnitude of a power supply voltage source prior to transmission of a signal upon said signal line, comprising the steps of:

a) clamping said signal line to the power supply voltage source when a boost signal is at a first boost state;

b) boosting said signal line to the boost voltage when the boost signal is at the first boost state;

c) clamping said signal line to the power supply voltage source when a boost signal is at a second boost state;

d) boosting said signal line to the boost voltage when the boost signal is at the second boost state;

e) and continuously repeating said clamping and boosting steps to said signal line.

7. The method of claim 6 wherein the steps of clamping and boosting during the first boost state is accomplished in a first boosting circuit.

8. The method of claim 7 wherein the steps of clamping and boosting during the second boost state and is accomplished in a second boosting circuit.

9. The method of claim 8 wherein the repetitively proceeding from the steps of clamping and boosting during the first boost state and the first boosting state to the steps of clamping and boosting during the second boost state and the second boosting state and back the first boost state and first boosting state is controlled by a boost switching circuit.

10. The method of claim 9 wherein individually said first and second boosting circuit comprise:

a) a first MOSFET of a first conductivity type to selectively connect said boost voltage to said signal line, having a source and bulk connected to the signals line, a gate connected to said select signal and a drain;

b) a second MOSFET of the first conductivity type to selectively connect the power supply voltage source to provide an electrical charge to create said boost voltage, having a source and bulk connected to the power supply voltage source, a gate connected to the select signal, and drain connected to the drain of the first MOSFET of the first conductivity type; and c) a boost capacitor to store the electrical charge necessary to create said boost voltage, having a first plate coupled to the drains of the first and second MOSFET's of the first conductivity type, and a second plate connected to the boost control circuit;

and wherein said first and second boost circuit jointly include:

d) a third MOSFET of the first conductivity type to alternately connect and disconnect said signal line to the power supply voltage source, having a gate, a source connected to the power supply voltage source, and a drain and bulk connected to the signal line;

e) a MOSFET of a second conductivity type to control the connection of the third MOSFET to said signal line, having a gate connected to the gate of the fourth MOSFET of the first conductivity type, a source connected to a ground reference point, and drain connected the drain the gate of the third MOSFET of the first conductivity type; and f) a fourth MOSFET of the first conductivity type to control the connection of the third MOSFET to said signal line having a source and bulk connected to said signal line, a gate connected to the boost control circuit and a drain connected to the drain of the MOSFET of the second conductivity type.

11. The method of claim 10 wherein the switching circuit comprises:

a) a first logic switching circuit to control the storing of the electrical charge on the boost capacitor of the first boosting circuit, having a first input terminal coupled to a complementary boost signal, a second input terminal coupled to a select line, and a first output terminal coupled to the second plate of the boost capacitor of the first boosting circuit, wherein if the complementary boost signal and the select signal are at a first logic level said first output terminal approaches the voltage level of power supply voltage source and the boost capacitor of the first boosting circuit will accept the electrical charge and wherein if the complementary boost signal is at a second logic level and the select signal remains at the first logic level the first output terminal approaches is at the ground reference potential and the voltage level of the first plate of the boost capacitor of the first boosting circuit will become the level of the power supply voltage source;

b) a second logic switching circuit to control the storing of the electrical charge on the boost capacitor of the second boosting circuit, having a first input terminal coupled to the complementary boost signal, a second input terminal coupled to a complementary select line, and a second output terminal coupled to the second plate of the boost capacitor of the second boosting circuit, wherein if the complementary boost signal and the complementary select signal are at a first logic level said second output terminal is at the ground reference potential and the boost capacitor of the second boosting circuit will accept the electrical charge and wherein if the complementary boost signal is at the second logic level and the complementary select signal remains at the first logic level the second output terminal approaches a voltage level the is the power supply voltage source and the voltage level of the first plate of the boost capacitor of the second boosting circuit will become the level of said boost voltage;

c) a boost signal complementing circuit have a boost input terminal to receive a boost signal that will control generation of the boost voltage, and a boost complementer to invert said boost signal to create the complementary boost signal; and d) a select signal complementing circuit having a select input terminal to receive the select signal, and a select complementer to invert the select signal to create the complementary select signal.

12. A dynamic random access memory system to read and store digital data, comprising:

a) an array of memory storage cells arranged in rows and columns, wherein each memory storage cell will retain an electrical charge representing said digital data;

b) a row address decoder to select a row of memory storage cells of the array of storage cells for reading and storing;

c) a row driver circuit connect to the row address decoder to activate a selected row of memory storage cells;

d) a column address decoder to select one column of memory storage cells of the array of storage cells for reading and storing;

e) a column driver circuit coupled to the column address decoder and to a digital data input terminal to connect the digital data to the memory storage cells selected by the column address decoder for storing;

f) a sense amplifier coupled to the column address decoder to detect the electrical charge stored upon one memory storage cell selected by said column decoder and to amplify and convert said electrical charge to the digital data and to transfer said digital data to external circuitry;

g) a row signal line to connect each memory storage cell of a row of memory storage cells to the row driver circuit; and h) a ping-pong boost circuit connected to said row driver to supply a row driver boost voltage to restore a boost voltage to the row signal line to minimize a row cycle time of said dynamic random access memory system, whereby ping-pong circuit comprises:

a first boost circuit coupled between a power supply voltage source and a ground reference point to generate a first instance of said boost voltage;

a second boost circuit coupled between a power supply voltage source and a ground reference point to generate a second instance of said boost voltage;

a switching circuit connected between the first and second boost circuits and said signal line of said integrated circuit to alternately apply the first and second instances of the boost voltage to said signal line; and a boost control circuit connected to said switching circuit to provide a select signal that will control the alternate application of said first and second instances of the boost voltage and connected to said first and second boost circuits to provide a boost signal to control the generating of said first and second instances of the boost voltage.

13. The dynamic random access memory system of claim 12 wherein individually said first and second boost circuit comprises:

a) a first MOSFET of a first conductivity type to selectively connect said boost voltage to said signal line, having a source and bulk connected to the signals line, a gate connected to said select signal and a drain;

b) a second MOSFET of the first conductivity type to selectively couple the power supply voltage source to provide an electrical charge to create said boost voltage, having a source and bulk connected to the power supply voltage source, a gate connected to the select signal, and drain connected to the drain of the first MOSFET of the first conductivity type; and c) a boost capacitor to store the electrical charge necessary to create said boost voltage, having a first plate coupled to the drains of the first and second MOSS'S of the first conductivity type, and a second plate connected to the boost control circuit;

and wherein said first and second boost circuit jointly include:

d) a third MOSFET of the first conductivity type to alternately connect and disconnect said signal line to the power supply voltage source, having a gate, a source connected to the power supply voltage source, and a drain and bulk connected to the signal line;

e) a MOSFET of a second conductivity type to control the connection of the third MOSFET to said signal line, having a gate connected to the gate of the fourth MOSFET of the first conductivity type, a source connected to a ground reference point, and drain connected the drain the gate of the third MOSFET of the first conductivity type; and f) a fourth MOSFET of the first conductivity type to control the connection of the third MOSFET to said signal line having a source and bulk connected to said signal line, a gate connected to the boost control circuit and a drain connected to the drain of the MOSFET of the second conductivity type.

14. The dynamic random access memory system of claim 13 wherein the switching circuit comprises:

a) a first logic switching circuit to control the storing of the electrical charge on the boost capacitor of the first boost circuit, having a first input terminal coupled to a complementary boost signal, a second input terminal coupled to a select line, and a first output terminal coupled to the second plate of the boost capacitor of the first boost circuit, wherein if the complementary boost signal and the select signal are at a first logic level said first output terminal approaches the voltage level of power supply voltage source and the second boost capacitor of the first boost circuit will accept the electrical charge and wherein if the complementary boost signal is at a second logic level and the select signal remains at the first logic level the first output terminal approaches is at the ground reference potential and the voltage level of the first plate of the boost capacitor of the first boost circuit will become the level of the power supply voltage source;

b) a second logic switching circuit to control the storing of the electrical charge on the boost capacitor of the second boost circuit, having a first input terminal coupled to the complementary boost signal, a second input terminal coupled to a complementary select line, and a second output terminal coupled to the second plate of the boost capacitor of the second boost circuit, wherein if the complementary boost signal and the complementary select signal are at a first logic level said second output terminal is at the ground reference potential and the boost capacitor of the second boost circuit will accept the electrical charge and wherein if the complementary boost signal is at the second logic level and the complementary select signal remains at the first logic level the second output terminal approaches a voltage level the is the power supply voltage source and the voltage level of the first plate of the boost capacitor of the second boost circuit will become the level of said boost voltage;

c) a boost signal complementing circuit have a boost input terminal to receive a boost signal that will control generation of the boost voltage, and a boost complementer to invert said boost signal to create the complementary boost signal; and d) a select signal complementing circuit having a select input terminal to receive the select signal, and a select complementer to invert the select signal to create the complementary select signal.

* * * * *